(12) United States Patent
Saito

(10) Patent No.: US 9,196,762 B2
(45) Date of Patent: Nov. 24, 2015

(54) METHOD FOR MANUFACTURING SOLID-STATE IMAGING DEVICE, AND SOLID-STATE IMAGING DEVICE

(71) Applicant: Kabushiki Kaisha Toshiba, Tokyo (JP)

(72) Inventor: Jun Saito, Iwate (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 56 days.

(21) Appl. No.: 13/898,731

(22) Filed: May 21, 2013

(65) Prior Publication Data

US 2014/0125851 A1    May 8, 2014

(30) Foreign Application Priority Data

Nov. 6, 2012 (JP) ................................. 2012-244597

(51) Int. Cl.
| | |
|---|---|
| *H01L 31/0232* | (2014.01) |
| *H01L 31/0236* | (2006.01) |
| *H01L 27/146* | (2006.01) |
| *H04N 5/374* | (2011.01) |

(52) U.S. Cl.
CPC ...... *H01L 31/02327* (2013.01); *H01L 27/1462* (2013.01); *H01L 27/1464* (2013.01); *H01L 27/14625* (2013.01); *H01L 27/14685* (2013.01); *H01L 31/02363* (2013.01); *H04N 5/374* (2013.01)

(58) Field of Classification Search
None
See application file for complete search history.

(56) References Cited

U.S. PATENT DOCUMENTS

| | | | | |
|---|---|---|---|---|
| 4,952,524 A | * | 8/1990 | Lee et al. | 438/437 |
| 2011/0031576 A1 | * | 2/2011 | Iwasa et al. | 257/440 |
| 2011/0193147 A1 | | 8/2011 | Ahn et al. | |
| 2012/0058647 A1 | * | 3/2012 | Oh et al. | 438/771 |
| 2013/0062718 A1 | * | 3/2013 | Tada et al. | 257/432 |
| 2013/0134535 A1 | * | 5/2013 | Lenchenkov | 257/432 |

FOREIGN PATENT DOCUMENTS

| | | |
|---|---|---|
| JP | 4-82269 | 3/1992 |
| JP | 7-202149 | 8/1995 |
| JP | 2010-263096 A | 11/2010 |
| JP | 2011-66097 | 3/2011 |
| KR | 10-2003-0038838 A | 5/2003 |

OTHER PUBLICATIONS

Korean Office Action issued May 22, 2014 in Patent Application No. 10-2013-0056973 with English Translation.

* cited by examiner

*Primary Examiner* — Daniel Luke
(74) *Attorney, Agent, or Firm* — Oblon, McClelland, Maier & Neustadt, L.L.P.

(57) ABSTRACT

Certain embodiments provide a method for manufacturing a solid-state imaging device, including thinning a semiconductor substrate, forming a plurality of masking patterns, and forming a groove having inclined surfaces that are inclined relative to a front surface of the semiconductor substrate at a back surface of the semiconductor substrate. A plurality of light receiving sections are provided in a lattice pattern at the front surface of the semiconductor substrate to be thinned. A wiring layer including metal wirings is provided on the front surface of the semiconductor substrate to be thinned. The plurality of masking patterns are arranged in a lattice pattern on the back surface of the thinned semiconductor substrate. The groove is formed by etching the semiconductor substrate between the masking patterns using an etchant having an anisotropic etching property.

3 Claims, 11 Drawing Sheets

(a)

(b)

METHOD FOR MANUFACTURING SOLID-STATE IMAGING DEVICE, AND SOLID-STATE IMAGING DEVICE

CROSS REFERENCE TO RELATED APPLICATIONS

This application is based upon and claims the benefit of priority from the prior Japanese Patent Application No. 2012-244597 filed in Japan on Nov. 6, 2012; the entire contents of which are incorporated herein by reference.

FIELD

Embodiments described herein relate generally to a method for manufacturing a solid-state imaging device and the solid-state imaging device.

BACKGROUND

In a solid-state imaging device such as a CCD, CMOS image sensor and the like, especially in a solid-state imaging device for a camera in a cell phone, increase in pixels and reduction in device size are being demanded. As a solid-state imaging device that can address both of the demands, a so-called backside illuminating type solid-state imaging device (BSI: Back Side Illumination Solid State Image Sensor) that includes a wiring layer on a surface of a thinned semiconductor substrate, and receives incident light from a back surface side of the semiconductor substrate is known.

In the BSI, since the incident light is input from the back surface side of the semiconductor substrate, the incident light is photoelectrically converted at a back surface of the semiconductor substrate, and charges are generated. In contrast, a light receiving section is provided on a front surface of the semiconductor substrate. Accordingly, in the BSI, there is a problem that a distance between a position where the charges are generated and the light receiving section is far. If the distance between the position where the charges are generated and the light receiving section is far, there is a problem that the charges do not reach the light receiving section to which they are supposed to, but instead reach light receiving sections of other adjacent pixels, whereby color blending occurs. In a blue component of the incident light with a short wavelength (with high energy), since it is photoelectrically converted at a position that is very shallow in the back surface of the semiconductor substrate, the above problem occurs prominently.

As a BSI that can solve this problem, a BSI in which a light receiving section is formed deep in a back surface direction from a front surface of the semiconductor substrate is known. In order to form such the light receiving section, an acceleration voltage of ion implantation for forming the light receiving section needs to be raised to about 2,000 to 3,000 keV. However, since a crystal defect density in the semiconductor substrate increases due to the raise in the acceleration voltage, a so-called white defect (defect that stands out as a bright point in a dark environment) occurs in the manufactured BSI.

DESCRIPTION OF THE EMBODIMENTS

Figure 1:
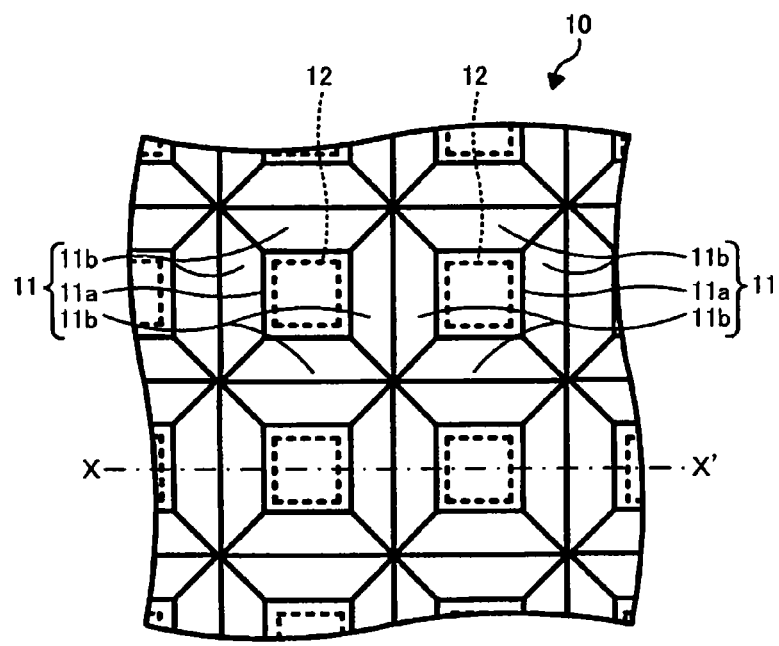
FIG. 1 is a top view showing a principal part of a solid-state imaging device according to a first embodiment.

Certain embodiments provide a method for manufacturing a solid-state imaging device, including thinning a semiconductor substrate, forming a plurality of masking patterns, and forming a groove having inclined surfaces that are inclined relative to a front surface of the semiconductor substrate at a back surface of the semiconductor substrate. A plurality of light receiving sections are provided in a lattice pattern at the front surface of the semiconductor substrate to be thinned. A wiring layer including metal wirings is provided on the front surface of the semiconductor substrate to be thinned. The plurality of masking patterns are arranged in a lattice pattern on the back surface of the thinned semiconductor substrate. The groove is formed by etching the semiconductor substrate between the masking patterns using an etchant having an anisotropic etching property.

Certain embodiments provide a method for manufacturing a solid-state imaging device, including thinning a semiconductor substrate, forming an insulating film, forming a photo resist film, forming a groove including an inclined surface, which is inclined with respect to a front surface of the semiconductor substrate, on a back surface of the photo resist film by exposing the back surface of the photo resist film, and transferring a shape of the groove on the back surface of the insulating film. A plurality of light receiving sections are provided in a lattice pattern on the front surface of the semiconductor substrate to be thinned. A wiring layer including metal wirings is provided on the front surface of the semiconductor substrate to be thinned. The insulating film is formed on the back surface of the thinned semiconductor substrate. The photo resist film is formed on the back surface of the insulating film. The photo resist film is exposed by using a mask including a plurality of nontransparent regions provided in a lattice pattern corresponding to the arrangement of the light receiving sections, and a transparent region that is adjusted such that a transmittance is adjusted to be higher toward a center between the nontransparent regions. The groove is formed by developing the exposed photo resist film.

Certain embodiments provide a solid-state imaging device including a semiconductor substrate, light condensing sections, and a wiring layer. A plurality of light receiving sections are provided in a lattice pattern on a front surface of the semiconductor substrate. The light condensing sections are provided for each of the light receiving sections on a back surface of the semiconductor substrate. Each of the light condensing sections includes a flat plane section that is parallel to the front surface of the semiconductor substrate, and a plurality of inclined surfaces surrounding the flat plane section and being inclined relative to the front surface of the semiconductor substrate. The wiring layer is provided on the front surface of the semiconductor substrate, and includes metal wirings.

Certain embodiments provide a solid-state imaging device including a semiconductor substrate, an insulating film, light condensing sections, and a wiring layer. A plurality of light receiving sections is provided in a lattice pattern on a front surface of the semiconductor substrate. The insulating film is provided on a back surface of the semiconductor substrate. The light condensing sections are provided for each of the light receiving sections at a back surface of the insulating film, and each of the light condensing sections includes a flat plane section that is parallel to the front surface of the semiconductor substrate, and a plurality of inclined surfaces surrounding the flat plane section and being inclined relative to the front surface of the semiconductor substrate. The wiring layer is provided on the front surface of the semiconductor substrate, and includes metal wirings.

Hereinbelow, the method for manufacturing the solid-state imaging device and the solid-state imaging device according to embodiments will be described.

First Embodiment

FIG. 1 is a top view showing a principal part of a solid-state imaging device 10 according to the first embodiment. As shown in FIG. 1, the solid-state imaging device 10 includes a plurality of light condensing sections 11. Each of the plurality of light condensing sections 11 is configured of a flat plane section 11a that is substantially square shaped, and inclined surface sections 11b that are four trapezoid-shaped flat surfaces surrounding the flat plane section 11a. Each of the inclined surface sections 11b is provided such that its short edge of the trapezoid makes contact with an edge configuring the flat plane section 11a.

Accordingly, the plurality of light condensing sections 11, each of which includes the flat plane section 11a and the inclined surface sections 11b, is arranged in a lattice pattern such that long edges of the inclined surface sections 11b make contact with one another.

Here, although the plurality of light condensing sections 11 is provided to make contact with one another as described above, the plurality of light condensing sections 11 is not necessarily provided to make contact with one another, and may be arranged to be separated from one another. That is, the plurality of light condensing sections 11 may be arranged in a lattice pattern such that the long edges of the inclined surface sections 11b are apart from one another.

Underneath each of the light condensing sections 11, a light receiving section 12 is provided at a position corresponding to centrally just below the light condensing section 11. The light receiving section 12 is a quadrilateral-shaped region, and its area is made narrower than an area of the flat plane section 11a of the light condensing section 11.

Such a plurality of light receiving sections 12 is provided at regular intervals by being arranged in a lattice pattern corresponding to the lattice pattern of the light condensing sections 11.

Hereinbelow, a region including a light condensing section 11 and a light receiving section 12 corresponding to this light condensing section 11 will be referred to as a pixel. That is, the solid-state imaging device 10 of the embodiment has a plurality of pixels arranged in a lattice pattern.

Figure 2:
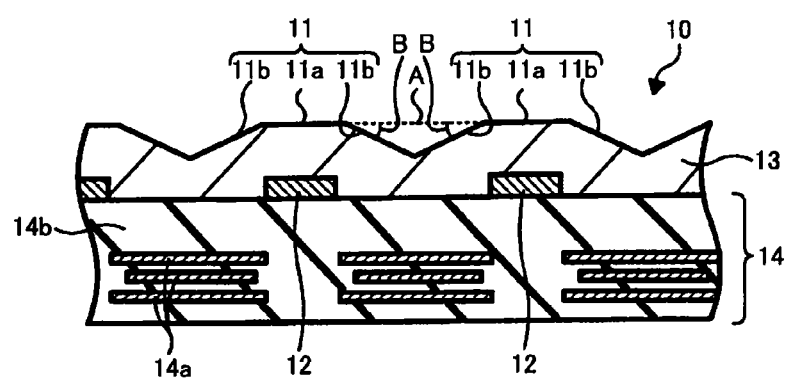
FIG. 2 is a cross sectional view of the solid-state imaging device that is cut along a dotted chain line X-X' in FIG. 1.

FIG. 2 is a cross sectional view of the solid-state imaging device 10 cut along a dotted chain line X-X' in FIG. 1. As shown in FIG. 2, in each pixel, the light condensing section 11 including the flat plane section 11a and the plurality of inclined surface sections 11b is provided by processing a back surface of a semiconductor substrate 13 formed for example of silicon (an upper surface of the semiconductor substrate 13 in FIG. 2) in a trapezoid shape.

The flat plane sections 11a of the light condensing sections 11 are the back surface of the semiconductor substrate 13, and are surfaces that are substantially parallel to a front surface of the semiconductor substrate 13 (a lower surface of the semiconductor substrate 13 in FIG. 2). In contrast, the inclined surface sections 11b of the light condensing sections 11 are surfaces inclined relative to the front surface of the semiconductor substrate 13. The inclined surface sections 11b are provided such that an angle B formed between a plane parallel to the flat plane section 11a shown by a dotted line A in the drawing and the inclined surface section 11b is at a desired angle. Here, the desired angle is an angle by which a blue component of incident light does not leak into adjacent pixels and is condensed at the light receiving portion 12 where the blue component should be condensed, and also green and red components of the incident light do not reach the adjacent pixels and are condensed at the light receiving portion 12 where the green and red components should be condensed, and is for example 10°.

Further, the light receiving section 12 that each pixel includes is for example formed of a photodiode layer provided by implanting impurity ions to the front surface of the semiconductor substrate 13.

A wiring layer 14 is provided on the front surface of the semiconductor substrate 13 that has the light condensing sections 11 at the back surface and the light receiving sections 12 at the front surface. The wiring layer 14 includes a plurality of layers of metal wirings 14a therein, and these metal wirings 14a are covered by an interlayer insulating film 14b. Here, each of the metal wirings 14a is provided in a region corresponding to an interval between the light receiving sections 12.

Such a solid-state imaging device 10 is a so-called backside illuminating type solid-state image sensor (BSI) that condenses the light entering from the back surface side of the semiconductor substrate 13 at the light receiving sections 12 by the light condensing sections 11.

A method for manufacturing the solid-state imaging device 10 according to the first embodiment as described above will be explained below with reference to FIG. 3 to FIG. 8. FIG. 3 to FIG. 8 respectively are cross sectional views corresponding to FIG. 2 for explaining the method for manufacturing the solid-state imaging device 10 according to the first embodiment.

Figure 3:
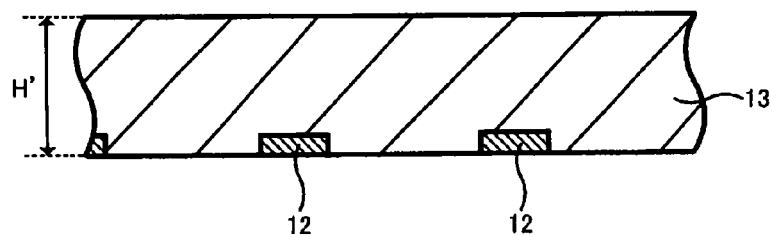
FIG. 3 is a cross sectional view for explaining a method for manufacturing the solid-state imaging device according to the first embodiment.

First, as shown in FIG. 3, the plurality of light receiving sections 12 is formed at regular intervals in a lattice pattern at certain regions on the front surface of the semiconductor substrate 13 that is formed for example of silicon with a thickness H' of about 800 µm. The light receiving sections 12 are provided by implanting N-type ions to the certain regions on the front surface of the semiconductor substrate 13 at a normal acceleration voltage (about 700 keV to 1,000 keV).

Here, although not shown in the drawings, in this step, transfer transistors and the like for transferring charges generated by receiving light at the light receiving sections 12 are also formed.

Figure 4:
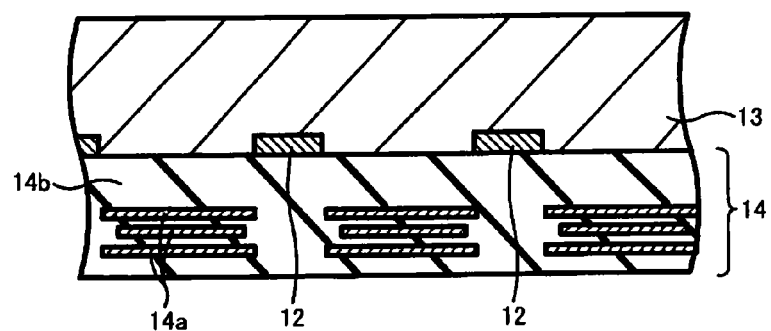
FIG. 4 is a cross sectional view for explaining a method for manufacturing the solid-state imaging device according to the first embodiment.

Next, as shown in FIG. 4, the wiring layer 14 is formed on the front surface of the semiconductor substrate 13 on which the light receiving sections 12, the transfer transistors and the like are formed. The wiring layer 14 may be provided by repeatedly forming the interlayer insulating film 14b and the metal wirings 14a.

Figure 5:
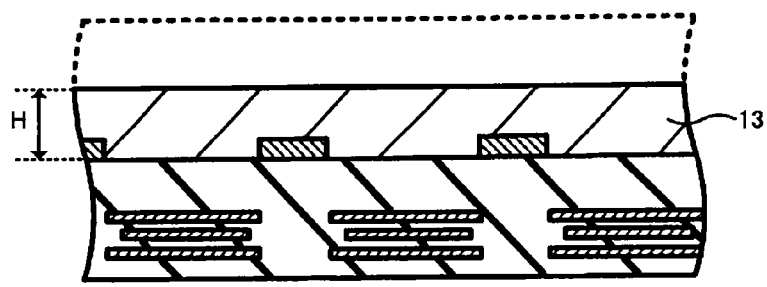
FIG. 5 is a cross sectional view for explaining a method for manufacturing the solid-state imaging device according to the first embodiment.

Next, as shown in FIG. 5, the semiconductor substrate 13 is thinned from the back surface. The thinning may be performed for example by polishing the back surface of the semiconductor substrate 13 until the thickness H of the semiconductor substrate 13 becomes about 10 µm.

Figure 6:
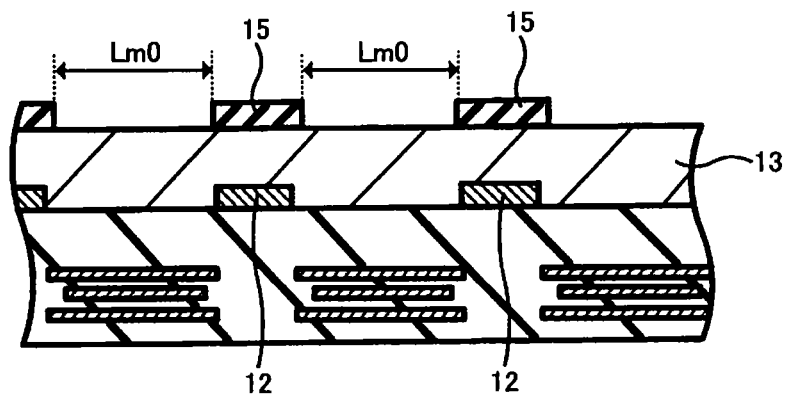
FIG. 6 is a cross sectional view for explaining a method for manufacturing the solid-state imaging device according to the first embodiment.

Next, as shown in FIG. 6, a plurality of masking patterns 15 is formed on the back surface of the thinned semiconductor substrate 13. Each of the plurality of masking patterns 15 may for example be a patterned photo resist, or similarly may be a patterned thermal oxidation film, a vapor-phase epitaxial film, and the like.

In the embodiment, a shape of a cross section parallel to the front surface of the semiconductor substrate 13 of each of the masking patterns 15 is substantially square, and an area of the cross section of each of the masking patterns 15 is larger than an area of the light receiving section 12 in the above cross section. Such a plurality of masking patterns 15 is arranged in a lattice pattern corresponding to the lattice pattern of the light receiving sections 12 above the light receiving sections 12. The masking patterns 15 that are arranged are apart from each other at an interval Lm0.

Figure 7:
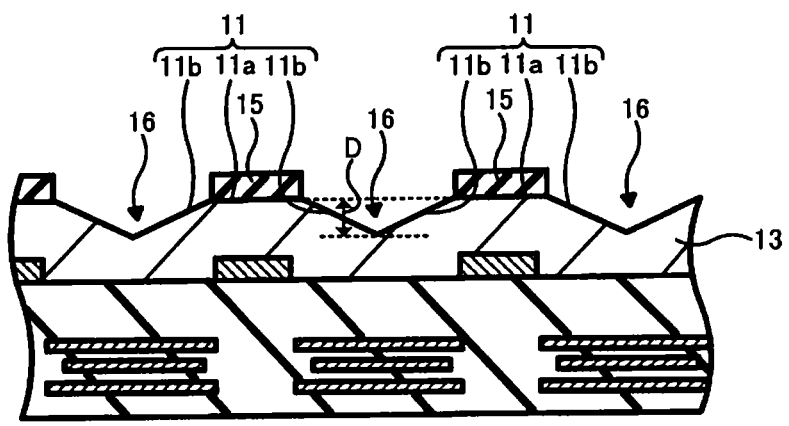
FIG. 7 is a cross sectional view for explaining a method for manufacturing the solid-state imaging device according to the first embodiment.
Figure 8:
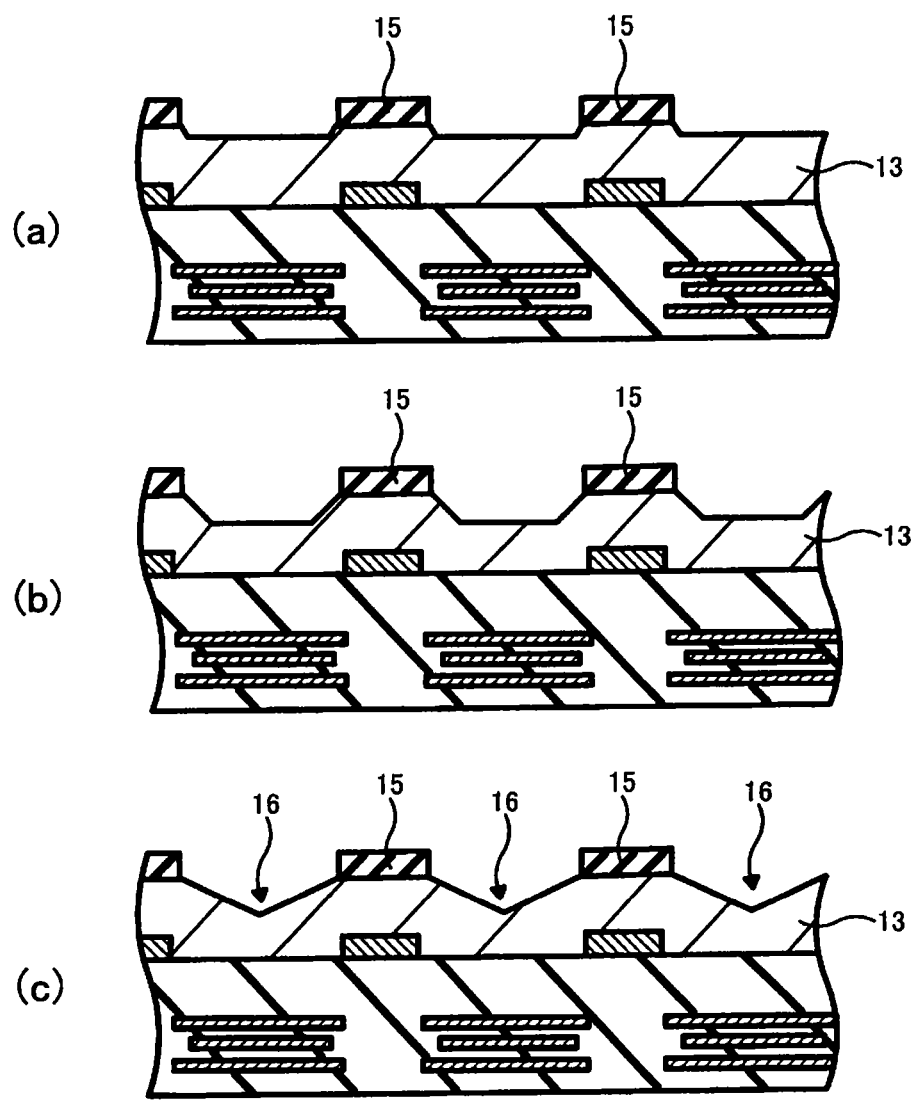
FIG. 8 is a diagram for explaining an etching step of a semiconductor substrate shown in FIG. 7 in detail.

Next, as shown in FIG. 7, a groove 16 including inclined surfaces inclined relative to the front surface of the semiconductor substrate 13, that is, a V-shaped groove 16 with a depth D of about 20 nm for example is provided on the semiconductor substrate 13 between the masking patterns 15 by etching the semiconductor substrate 13 on which the plurality of masking patterns 15 is provided. As a result, the plurality of light condensing sections having the flat plane sections 11a and the pluralities of inclined surface sections 11b are provided on the back surface of the semiconductor substrate 13 so as to be in contact with each other.

The V-shaped groove 16 is formed by using a suitable anisotropic etchant for the semiconductor substrate 13. FIGS. 8A, 8B, 8C are diagrams that show how the semiconductor substrate 13 is etched in this step in a chronological order. In this step, the semiconductor substrate 13 is subjected to wet etching using an etchant by which an etching rate in a depth direction of the semiconductor substrate 13 becomes suitably faster than an etching rate in a horizontal direction of the semiconductor substrate 13. Accordingly, as shown in FIGS. 8A, 8B, 8C in the chronological order, the etching on a back surface portion of the semiconductor substrate 13 exposed from the masking patterns 15 progresses faster in the depth direction than in the horizontal direction, and in the end as shown in FIG. 8C, the back surface of the semiconductor substrate 13 is etched so that the V-shaped groove 16 is formed between the masking patterns 15.

Here, the V-shaped groove 16 is formed such that the angle B (FIG. 2) formed by the plane A parallel to the flat plane section 11a and the inclined surface sections 11b is 55° C. by using a silicon substrate with a <1, 1, 0> plane as the back surface as the semiconductor substrate 13 and performing the wet etching on the silicon substrate by using for example potassium hydroxide (KOH) as the anisotropic etchant for the <1, 1, 0> plane of the silicon substrate.

Such an etching process is performed by selecting an etching condition such as an etchant composition and the like so that the angle B (FIG. 2) formed by the plane A (FIG. 2) parallel to the flat plane section 11a and the inclined surface sections 11b of the light condensing section 11 to be formed becomes the desired angle (for example, 10°).

Finally, by removing the masking patterns 15 used in the etching process, the solid-state imaging device 10 shown in FIG. 1 and FIG. 2 is manufactured.

Figure 9:
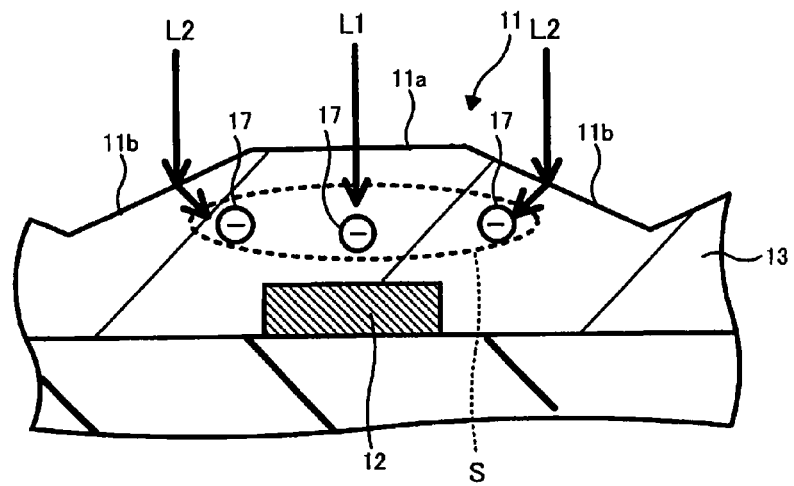
FIG. 9 is an explanatory diagram for explaining how incident light is received by the solid-state imaging device, where FIG. 9A therein is an explanatory diagram for explaining how the incident light is received by the solid-state imaging device according to the first embodiment, and FIG. 9B therein is an explanatory diagram for explaining how incident light is received by a conventional solid-state imaging device in which a back surface of a semiconductor substrate is flat.
Figure 9:
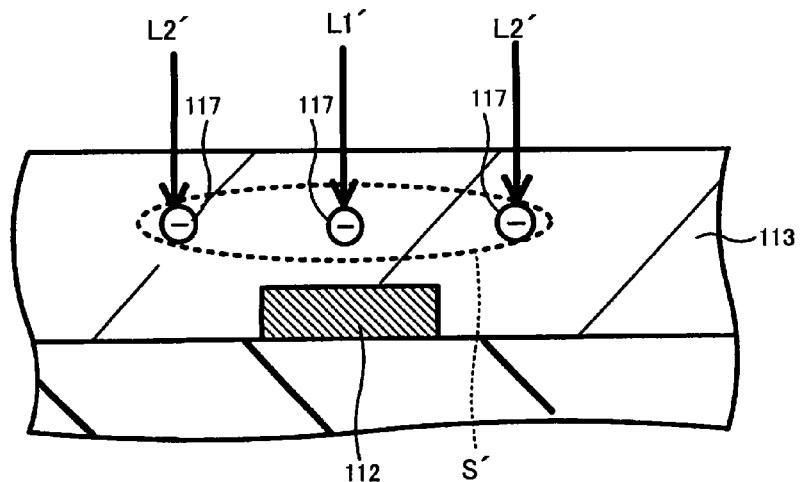

FIG. 9A is an explanatory diagram for explaining a manner in which the incident light is received by the solid-state imaging device 10 manufactured through the manufacturing step explained above. As shown in FIG. 9A, when the incident light is input to the light condensing section 11, light L1 input to the flat plane section 11a progresses inside the semiconductor substrate 13 in a vertical direction relative to the flat plane section 11a, and light L2 input to the inclined surface sections 11b of the light condensing section 11 refracts at the inclined surface sections 11b, and progresses inside the semiconductor substrate 13 toward a central direction of the light receiving section 12. Accordingly, when the incident light L1, L2 is input to the light condensing section 11, the light condensing section 11 condenses the incident light L1, L2 toward the central direction of the light receiving section 12. Accordingly, the incident light L1, L2 is photoelectrically converted in a narrow region S in the semiconductor substrate 13, and charges 17 are generated in the narrow region S.

FIG. 9B is an explanatory diagram for explaining how incident light is received by a conventional solid-state imaging device in which a back surface of the semiconductor substrate is flat. In the below description, a region corresponding to the flat plane section of the solid-state imaging device of the embodiment will be referred to as a central portion of a pixel, and a region corresponding to the inclined surface sections will be referred to as a peripheral portion.

As shown in FIG. 9B, when the incident light is input to a semiconductor substrate 113 with a flat back surface, light L1' input to the central portion of the pixel progresses inside the semiconductor substrate 113 in a vertical direction relative to the back surface of the semiconductor substrate 113. However, light L2' input to the peripheral portion of the pixel also progresses inside the semiconductor substrate 113 in the vertical direction relative to the back surface of the semiconductor substrate 113. Accordingly, even if the incident light L1', L2' is input to the semiconductor substrate 113, especially the light L2' input to the peripheral portion of the pixel is not condensed toward a central direction of the light receiving section 112. Thus, the incident light L1', L2' is photoelectrically converted in a wide region S' (>region S (FIG. 9A)) in the semiconductor substrate 113, and charges 117 are generated in this wide region S'.

As is clear from FIG. 9A and FIG. 9B, when the incident light L1, L2 is input to the solid-state imaging device 10 of the embodiment, the incident light L1, L2 is condensed toward the central direction of the light receiving section 12 in the light condensing section 11. Thus, compared to the case in which the incident light L1', L2' is input to the conventional solid-state imaging device having the flat back surface of the semiconductor substrate 113, the incident light L1, L2 can be photoelectrically converted in the narrow region S, and the charges can be generated thereby. As a result, compared to the conventional solid-state imaging device, since the charges 17 can be generated in the vicinity of the light condensing section 11 than in the conventional case, it is suppressed that the charges 17 reach the light receiving sections 12 of other adjacent pixels, and color blending is suppressed.

Here, according to the solid-state imaging device of the embodiment, compared to the conventional solid-state imaging device, the color blending of the blue component of the incident light L2 input to the inclined surface sections 11b (peripheral portion of the pixel) is especially suppressed.

As explained above, according to the embodiment, the solid-state imaging device that can suppress the color blending can be manufactured without forming the light receiving sections 12 deep in the back surface direction from the front surface of the semiconductor substrate 13. Accordingly, the method for manufacturing the solid-state imaging device, and the solid-state imaging device by which the color blending can be suppressed, and generation of a white defect, an increase in the crystal defect density, and generation of a potential displacement of pixels and the like can be suppressed can be provided.

Further, according to the embodiment, the light condensing sections 11 are provided on the back surface of the semiconductor substrate 13 by etching without melting the semiconductor substrate 13 at a high temperature. Accordingly, the method for manufacturing the solid-state imaging device, and the solid-state imaging device by which the color blending can be suppressed, and curving of the semiconductor substrate 13, generation of warpage, contamination of the semiconductor substrate 13 caused by impurities, and changes in element property of the transistors and the like and electric property of the metal wirings 14a can be suppressed can be provided.

That is, according to the embodiment, the method for manufacturing the solid-state imaging device, and the solid-state imaging device by which the color blending can be suppressed, and deterioration of imaging property can be suppressed can be provided.

Second Embodiment

Figure 10:
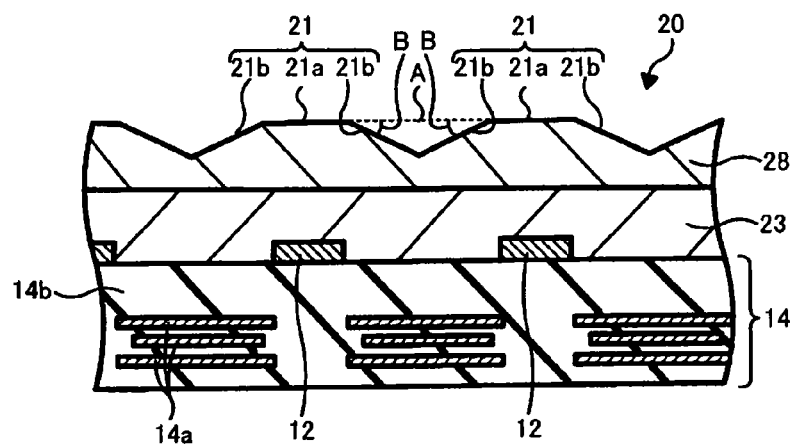
FIG. 10 is across sectional view of a principal part of a solid-state imaging device according to a second embodiment that corresponds to FIG. 2.

FIG. 10 is a cross sectional view of a solid-state imaging device 20 according to the second embodiment. Compared to the solid-state imaging device 10 according to the first embodiment, the solid-state imaging device 20 shown in FIG. 10 differs in that light condensing sections 21 are provided in an insulating film 28 provided on a back surface of a semiconductor substrate 23. Here, since other configurations are similar to the solid-state imaging device 10 according to the first embodiment, explanations thereof will be omitted.

That is, in the solid-state imaging device 20 according to the second embodiment, the back surface of the semiconductor substrate 23 is formed flat, and the insulating film 28 that allows incident light to be penetrated is provided on the back surface of such a semiconductor substrate 23. The insulating film 28 is formed for example of $SiO_2$, $Si_3N_4$, and the like.

The light condensing sections 21, each including a flat plane section 21a and inclined surface sections 21b, are provided on the back surface of the insulating film 28 (upper surface in FIG. 10) similar to the light condensing sections 11 provided in the solid-state imaging device 10 according to the first embodiment.

The solid-state imaging device 20 is manufactured as follows. FIG. 11 to FIG. 15 are respectively cross sectional views for explaining the method for manufacturing the solid-state imaging device 20 according to the second embodiment.

First, similar to the method for manufacturing the solid-state imaging device 10 according to the first embodiment, as shown in FIG. 3 to FIG. 5, light receiving sections 12 and the like are formed on a front surface of a semiconductor substrate 23, and a wiring layer 14 is formed on the front surface of the semiconductor substrate 23, and the semiconductor substrate 23 is thinned.

Figure 11:
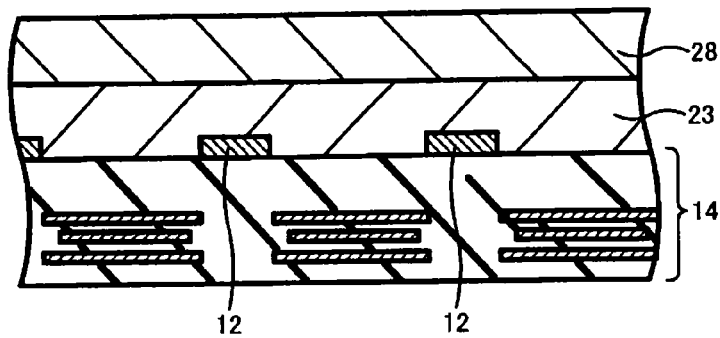
FIG. 11 is across sectional view for explaining a method for manufacturing the solid-state imaging device according to the second embodiment.

Thereafter, as shown in FIG. 11, an insulating film 28 formed of $SiO_2$, $Si_3N_4$ and the like is deposited for example by a CVD method on a back surface of the thinned semiconductor substrate 23.

Figure 12:
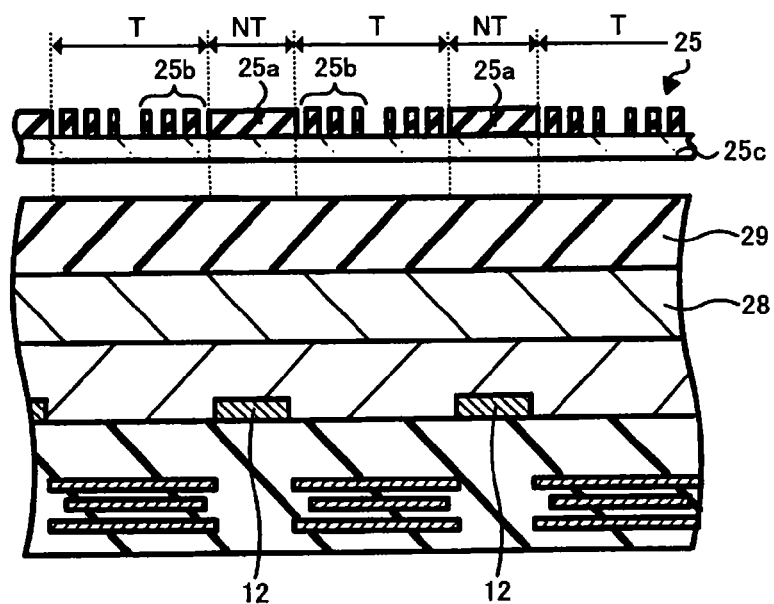
FIG. 12 is a cross sectional view for explaining a method for manufacturing the solid-state imaging device according to the second embodiment.

Next, as shown in FIG. 12, a photo resist film is applied evenly on a back surface of the insulating film 28 (upper surface in FIG. 12). The photo resist film 29 is formed of a material having a same etching rate as the insulating film 28.

Subsequently, a mask 25 for exposing certain positions of the photo resist film 29 is arranged on a back surface of the photo resist film 29 (upper surface in FIG. 12). Thereafter, by using an exposure apparatus, the photo resist 29 is exposed via the mask 25.

The mask 25 is a mask in which a plurality of first masking patterns 25a that blocks exposure light is arranged in a lattice pattern by being separated at intervals that is equal to or greater than a theoretical resolution limitation of the exposure apparatus on a surface of a transparent substrate 25c such as a glass substrate that allows the exposure light to be transmissive, and is a mask that sets a region in which each of the first masking patterns 25a is provided as a nontransparent region NT.

Further, the mask 25 sets the intervals between the plurality of first masking patterns 25a (between the nontransparent regions NT) as a transparent region T, and is a mask that is adjusted so that a transmittance of the exposure light becomes higher toward a center of the transparent region T.

Such a mask 25 is realized for example by arranging a plurality of second masking patterns 25b between the plurality of first masking patterns 25a, where the plurality of second masking patterns 25b have a size (area) smaller than the first masking patterns 25a, have the size (area) and an arrangement density suitably adjusted, and are apart from each other at intervals that are less than the theoretical resolution limitation of the exposure apparatus.

That is, in the transparent region T, the size (area) of the plurality of second masking patterns 25b is adjusted to be smaller for the patterns arranged at the center of the transparent region T. Further, in the transparent region T, an arrangement density of the plurality of second masking patterns 25b is adjusted to become sparser toward the center of the transparent region T.

In an exposing step shown in FIG. 12, after having adjusted the position of the mask 25 so that each of the first masking patterns 25a is positioned just above the corresponding light receiving section 12, the photo resist 29 is exposed via the mask 25 by using the exposure apparatus.

As a result, the exposure light is substantially not irradiated onto the photo resist 29 just below the nontransparent regions NT. Further, although the exposure light is irradiated onto the photo resist 29 just below the transparent region T, the exposure light is irradiated onto a region corresponding to the center of the transparent region T in the photo resist 29 just below the transparent region T at a greater degree.

Figure 13:
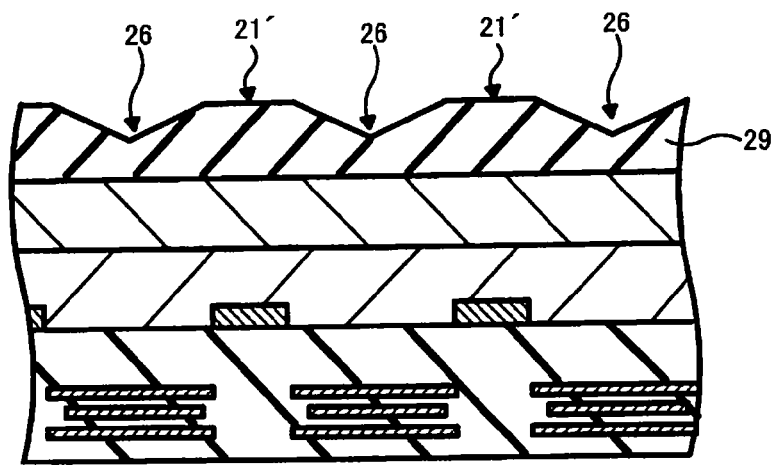
FIG. 13 is a cross sectional view for explaining a method for manufacturing the solid-state imaging device according to the second embodiment.

After having exposed the photo resist film 29 by using such a mask 25, when the exposed photo resist film 29 is developed, the exposed portion is removed in accordance with an amount of exposure. Accordingly, when the exposed photo resist film 29 is developed, as shown in FIG. 13, V-shaped grooves 26 are formed on the back surface of the photo resist film 29, and matrixes 21' of light condensing sections 21 are formed on the back surface of the photo resist film 29.

Figure 14:
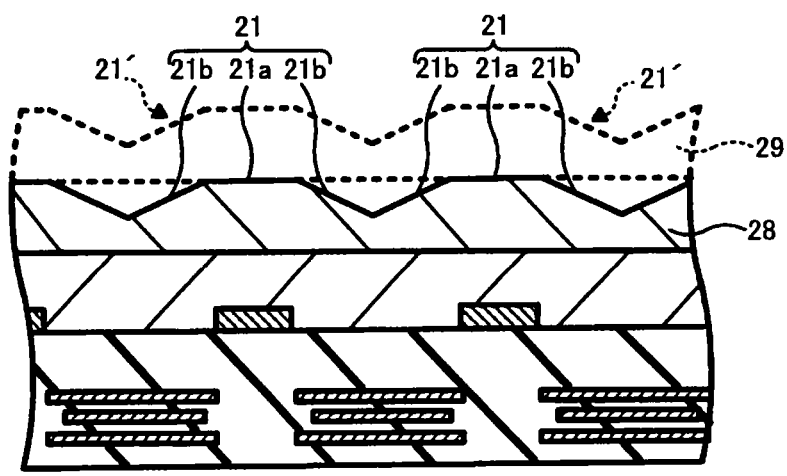
FIG. 14 is a cross sectional view for explaining a method for manufacturing the solid-state imaging device according to the second embodiment.

After having removed the mask 25, as shown in FIG. 14, the photo resist film 29 is removed by etching until an entirety of the photo resist film 29 on which the matrixes 21' of the light condensing sections 21 are provided disappears, and the shape of the matrixes 21' of the light condensing sections 21 are transferred onto the back surface of the insulating film 28. In this step, since the etching rates of the photo resist film 29 and the insulating film 28 are equal, the shape of the matrix 21' of the light condensing sections 21 is transferred onto the back surface of the insulating film 28 with no change occurring in its shape.

Due to this, a plurality of light condensing sections 21, each of which including a flat plane section 21a and inclined surface sections 21b, are formed in a lattice pattern on the back surface of the insulating film 28, and the solid-state imaging device 20 shown in FIG. 10 is manufactured.

Also in the solid-state imaging device 20 manufactured as above, in the light condensing sections 21, the incident light is condensed toward a central direction of the light receiving sections 12. Accordingly, color blending is suppressed.

Also in the second embodiment as explained above, the solid-state imaging device that can suppress the color blending can be manufactured without forming the light receiving sections 12 deep in a back surface direction from the front surface of the semiconductor substrate 23. Accordingly, the method for manufacturing the solid-state imaging device, and the solid-state imaging device by which the color blending can be suppressed, and generation of a white defect, an increase in the crystal defect density, and generation of a potential displacement of pixels and the like can be suppressed can be provided.

Further, according to the embodiment, the light condensing sections 21 are provided on the back surface of the insulating film 28 by etching without melting the semiconductor substrate 23 at a high temperature. Accordingly, the method for manufacturing the solid-state imaging device, and the solid-state imaging device by which the color blending can be suppressed, and curving of the semiconductor substrate 23, generation of warpage, contamination of the semiconductor substrate 23 caused by impurities, and changes in element property of the transistors and the like and electric property of metal wirings 14a can be suppressed can be provided.

That is, according to the embodiment, the method for manufacturing the solid-state imaging device, and the solid-state imaging device by which the color blending can be suppressed, and deterioration of imaging property can be suppressed can be provided.

Here, the method for manufacturing the solid-state imaging device 20 according to the embodiment can form the light condensing sections 21 in the insulating film 28 as above even in a case where a CVD film by which a desired anisotropy in etching is difficult to be obtained is adapted as the insulating film 28.

Third Embodiment

Figure 15:
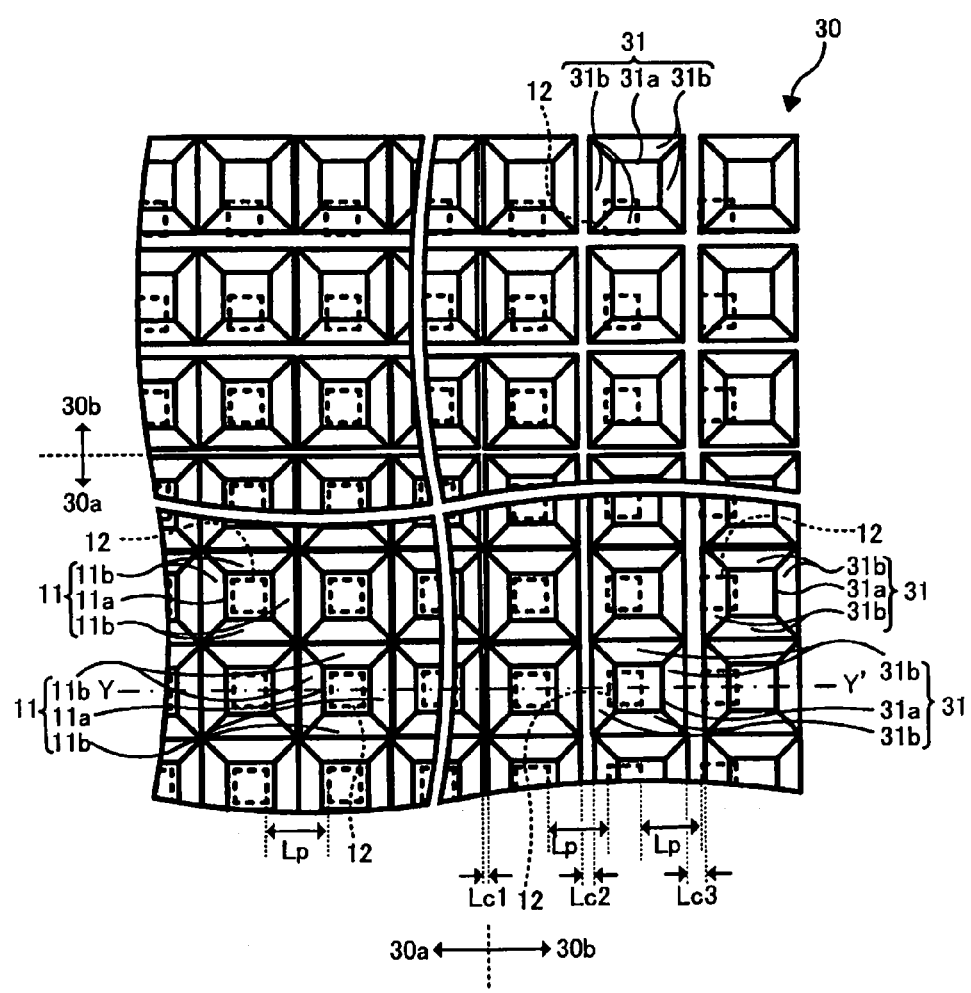
FIG. 15 is a top view showing a principal part of a solid-state imaging device according to a third embodiment.
Figure 16:
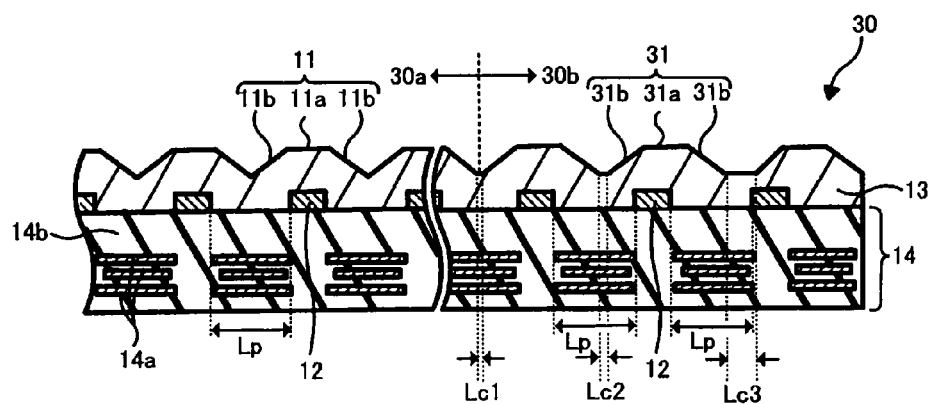
FIG. 16 is a cross sectional view of the solid-state imaging device that is cut along a dotted chain line Y-Y' in FIG. 15.

FIG. 15 is a top view showing a principal part of a solid-state imaging device 30 according to the third embodiment, and FIG. 16 is a cross sectional view of the solid-state imaging device 30 cut along a dotted chain line Y-Y' in FIG. 15.

Compared to the solid-state imaging device 10 according to the first embodiment, in the solid-state imaging device 30 shown in FIG. 15 and FIG. 16, although light condensing sections 11 at a central portion 30a of the solid-state imaging device 30 are configured identically, positions of light condensing sections 31 of a peripheral portion 30b are different. Here, since other configurations are similar to the solid-state imaging device 10 according to the first embodiment, explanations thereof will be omitted.

That is, in the solid-state imaging device 10 according to the first embodiment, all of the light condensing sections 11 are provided to be in contact with each other (FIG. 1). In contrast, in the solid-state imaging device 30 according to the third embodiment, although the light condensing sections 11 provided in the central portion 30a are provided to be in contact with each other, the light condensing sections 31 provided in the peripheral portion 30b are provided to be apart from each other.

Further, the light condensing sections 31 in the peripheral portion 30b are provided such that their intervals become wider toward an outer region of a semiconductor substrate 13, such as Lc1, Lc2, and Lc3.

Here, each of the light condensing sections 31 in the peripheral portion 30b is similar to the shape of the light condensing sections 11 in the central portion 30a, and includes a flat plane section 31a and inclined surface sections 31b.

In contrast, light receiving sections 12 are formed by being arranged in a lattice pattern at intervals Lp that are substantially equal in the central portion 30a as well as in the peripheral portion 30b, similar to the solid-state imaging device according to the first embodiment.

Accordingly, in the peripheral portion 30b of the solid-state imaging device 30 according to the third embodiment, when viewed from the light condensing sections 31, positions of the corresponding light receiving sections 12 are provided at positions displaced in a central direction of the semiconductor substrate 13 with greater degree on the outer side of the semiconductor substrate 13.

Figure 17:
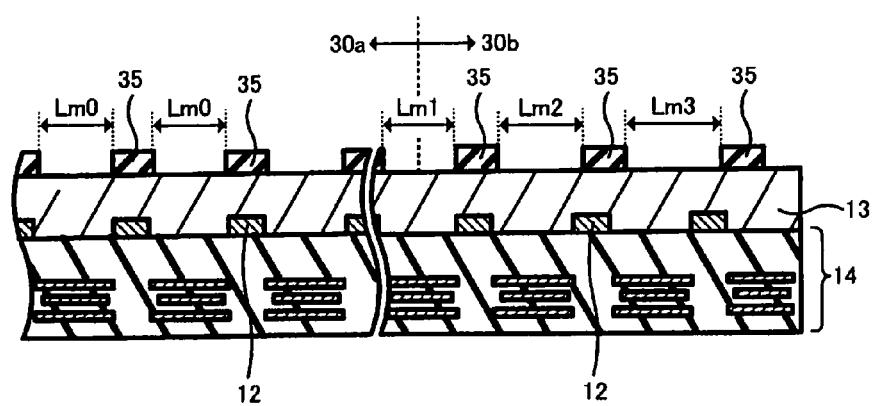
FIG. 17 is a cross sectional view for explaining the method for manufacturing the solid-state imaging device according to the third embodiment.
Figure 18:
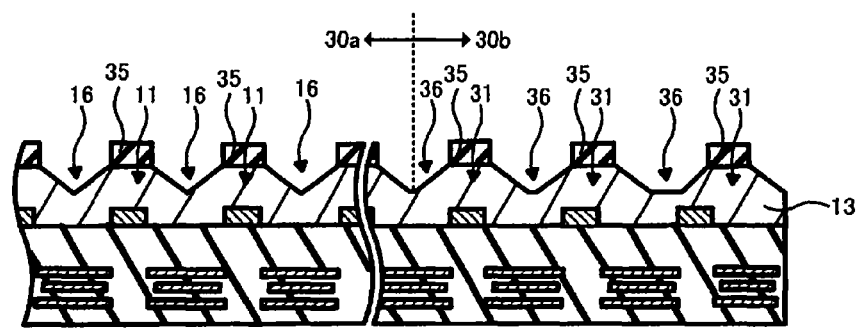
FIG. 18 is a cross sectional view for explaining the method for manufacturing the solid-state imaging device according to the third embodiment.

The solid-state imaging device 30 is manufactured as follows. FIG. 17 and FIG. 18 are respectively cross sectional views of the solid-state imaging device for explaining a method for manufacturing the solid-state imaging device 30 according to the third embodiment.

First, similar to the method for manufacturing the solid-state imaging device 10 according to the first embodiment, as shown in FIG. 3 to FIG. 5, the light receiving sections 12 and the like are formed on a front surface of the semiconductor substrate 13, and a wiring layer 14 is formed on the front surface of the semiconductor substrate 13, and the semiconductor substrate 13 is thinned.

Thereafter, as shown in FIG. 17, a plurality of masking patterns 35 is formed at certain positions on a back surface of the thinned semiconductor substrate 13. Each of the masking patterns 35 is similar to the masking pattern 15 used in the method for manufacturing the solid-state imaging device in the first embodiment.

Similar to the method for manufacturing the solid-state imaging device of the first embodiment, each of the masking patterns 35 in the central portion 30a is arranged just above the light receiving sections 12 in a lattice pattern corresponding to the lattice pattern of the light receiving section 12 so as to be apart from each other at regular intervals Lm0.

In contrast, the plurality of masking patterns 35 in the peripheral portion 30b is provided such that their intervals become wider toward the outer side of the semiconductor substrate 13, such as Lm1, Lm2, and Lm3.

Next, as shown in FIG. 18, grooves 16, 36 are provided on the semiconductor substrate 13 between the masking patterns 35 by etching the semiconductor substrate 13 on which the plurality of masking patterns 35 is provided.

The groove 16 provided in the central portion 30a is provided in a V-shape similar to the method for manufacturing the solid-state imaging device of the first embodiment. However, the groove 36 provided in the peripheral portion 30b is provided in a trapezoidal shape. This is because the intervals Lm1, Lm2, and Lm3 of the masking patterns 35 provided in the peripheral portion 30b are wider than the intervals Lm0 of the masking patterns 35 provided in the central portion 30a. Accordingly, the plurality of light condensing sections 11 being in contact with each other is provided in the central portion 30a, and in the peripheral portion 30b, the plurality of light condensing sections 31 being apart from each other with wider intervals toward the outer side of the semiconductor substrate 13 is provided.

Finally, the masking patterns 35 are removed, and the solid-state imaging device 30 shown in FIG. 15 and FIG. 16 is manufactured.

Also in the third embodiment as explained above, the solid-state imaging device that can suppress the color blending can be manufactured without forming the light receiving sections 12 deep in a back surface direction from the front surface of the semiconductor substrate 13. Accordingly, the method for manufacturing the solid-state imaging device, and the solid-state imaging device by which the color blending can be suppressed, and generation of a white defect, an increase in the crystal defect density, and generation of a potential displacement of pixels and the like can be suppressed can be provided.

Further, according to the embodiment, the light condensing sections 11, 31 are provided on the back surface of the semiconductor substrate 13 by etching without melting the semiconductor substrate 13 at a high temperature. Accordingly, the method for manufacturing the solid-state imaging device, and the solid-state imaging device by which the color blending can be suppressed, and curving of the semiconductor substrate 13, generation of warpage, contamination of the semiconductor substrate 13 caused by impurities, and changes in element property of the transistors and the like and electric property of the metal wirings 14a can be suppressed can be provided.

That is, according to the embodiment, the method for manufacturing the solid-state imaging device, and the solid-state imaging device by which the color blending can be suppressed, and deterioration of imaging property can be suppressed can be provided.

Further, according to the solid-state imaging device 30 according to the third embodiment, the plurality of light condensing sections 11 is provided in the central portion 30a so as to be in contact with each other, and the plurality of light condensing sections 31 is provided in the peripheral portion 30b so as to be apart from each other with wider intervals toward the outer side of the semiconductor substrate 13. Accordingly, by mounting such a solid-state imaging device 30 in a camera module, sensitivity of the camera module can be improved.

That is, for example, in the case where the solid-state imaging device 30 is adapted to the camera module, incident light from a central portion of a lens of the camera module is input to the central portion 30a of the solid-state imaging device 30. Accordingly, in the central portion 30a of the solid-state imaging device 30, the incident light is input almost vertically, and the incident light is condensed centrally just below the light condensing sections 11. However, the incident light from a peripheral portion of the lens is input obliquely to the peripheral portion 30b of the solid-state imaging device 30 from an outer direction of the solid-state imaging device 30. Accordingly, the light entering from the oblique direction is condensed at a position displaced toward an inner side of the solid-state imaging device 30 as seen from positions centrally just below the light condensing sections 31.

According to the solid-state imaging device 30 of the embodiment, the light receiving sections 12 are provided at positions where the incident light is condensed in accordance with an incident angle of the incident light as seen from the light condensing sections 11, 31. That is, the light receiving sections 12 in the central portion 30a are provided centrally just below the light condensing sections 11, whereas the light receiving sections 12 in the peripheral portion 30b are provided at the positions displaced toward the inner side of the device as seen from the positions centrally just below the light condensing sections 31. Accordingly, the incident light input via the lens of the camera module is condensed in the light receiving sections 12, not only in the central portion 30a but also in the peripheral portion 30b. Accordingly, by mounting the solid-state imaging device 30 of the embodiment in the camera module, the sensitivity of the camera module can be improved.

Figure 19:
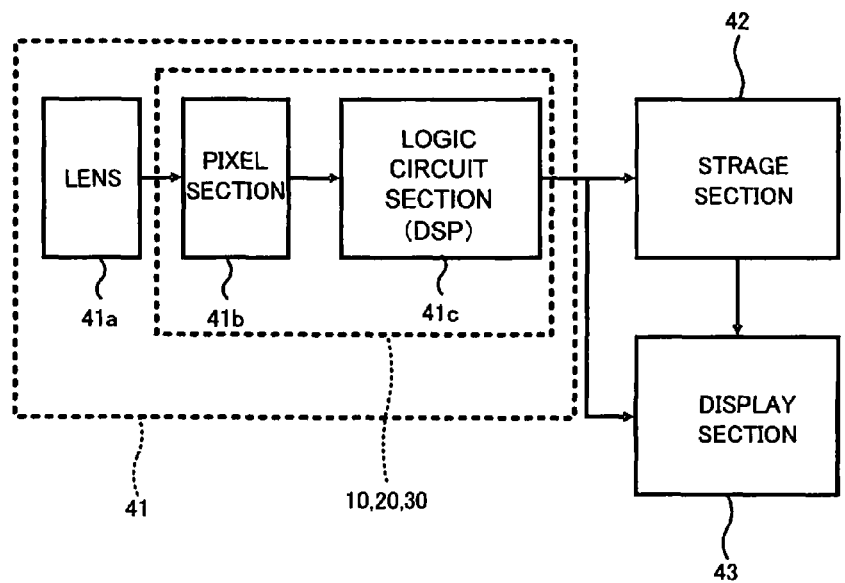
FIG. 19 is a block diagram schematically showing an electronic device using the solid-state imaging device according to the respective embodiments.

The solid-state imaging devices 10, 20, 30 according to the respective embodiments explained above are mounted in a camera module 41 mounted in an electronic device 40 such as a digital camera, a cell phone, and the like. FIG. 19 is a block diagram schematically showing the electronic device 40 in which the camera module 41 mounting one of the solid-state imaging devices 10, 20, 30 according to the respective embodiments is mounted.

Other than the camera module 41, the electronic device 40 includes a storage section 42 that stores signals output from the camera module 41, and a display section 43 that displays an image based on the signals output from the camera module 41.

In the electronic device 40, light condensed by a lens 41a of the camera module 41 is received by a pixel section 41b of the solid-state imaging element 10, 20, or 30. In so doing, the pixel section 41b outputs voltage signals corresponding to the received light to a logic circuit section 41c of the solid-state imaging element 10, 20, or 30. The logic circuit section 41c performs a desired signal processing on the received voltage signals, and outputs the same to the storage section 42 or the display section 43. The display section 43 receives the signals that had undergone the signal processing in the logic circuit section 41c from the logic circuit section 41c or the storage section 42, and displays an image based on the received signals.

Accordingly, if one of the solid-state imaging devices 10, 20, 30 is mounted in the electronic device 40, the electronic device 40 can cause the display section 42 to display an image with a high quality. Especially, if the camera module 41 in which the solid-state imaging device 30 is mounted is mounted in the electronic device 40, the electronic device 40 can cause the display section 42 to display an image with even a higher quality.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a solid-state imaging device, the method comprising:
    thinning a semiconductor substrate having a front surface provided with a plurality of light receiving sections in a lattice pattern, and having a wiring layer including metal wirings on the front surface thereof, the plurality of light receiving sections being provided so as to be apart from each other at regular intervals;
    forming a plurality of masking patterns arranged in a lattice pattern on a back surface of the thinned semiconductor substrate, the plurality of masking patterns being formed so as to be apart from each other at regular intervals,
        wherein a shape of each of the plurality of masking patterns in a cross section parallel to the front surface of the semiconductor substrate is substantially square, and an area of the masking pattern in the cross section is larger than an area of the light receiving section in the cross section; and
    forming a plurality of light condensing sections, each of which includes a flat plane section parallel to the front surface of the semiconductor substrate and a plurality of inclined surfaces surrounding the flat plane section and being inclined relative to the front surface of the semiconductor substrate, on the back surface of the semiconductor substrate by forming a groove having the inclined surface on the back surface of the semiconductor substrate by etching the semiconductor substrate between the masking patterns using an etchant having an anisotropic etching property,
        wherein the groove between the plurality of masking patterns is a V-shaped groove, and
        wherein a shape of the flat plane section in the cross section is substantially square, and an area of the flat plane section in the cross section is larger than an area of the light receiving section in the cross section.

2. The method for manufacturing a solid-state imaging device according to claim 1, wherein
    the semiconductor substrate is a silicon substrate of which back surface is a <1,0,0> plane, and
    the etchant is an etchant that is anisotropic to the <1,0,0> plane of the silicon substrate.

3. A method for manufacturing a solid-state imaging device, the method comprising:
    thinning a semiconductor substrate having a front surface provided with a plurality of light receiving sections in a lattice pattern, and having a wiring layer including metal wirings on the front surface thereof, the plurality of light receiving sections being provided so as to be apart from each other at regular intervals;
    forming a plurality of masking patterns arranged in a lattice pattern on a back surface of the thinned semiconductor substrate, the plurality of masking patterns arranged at a central portion of the semiconductor substrate being formed so as to be apart from each other at regular intervals, and the plurality of masking patterns arranged at a peripheral portion of the semiconductor substrate being formed such that intervals of the masking patterns become wider on an outer side of the semiconductor substrate,
        wherein a shape of each of the plurality of masking patterns in a cross section parallel to the front surface of the semiconductor substrate is substantially square, and an area of the masking pattern in the cross section is larger than an area of the light receiving section in the cross section; and
    forming a plurality of light condensing sections, each of which includes a flat plane section parallel to the front surface of the semiconductor substrate and a plurality of inclined surfaces surrounding the flat plane section and being inclined relative to the front surface of the semiconductor substrate, on the back surface of the semiconductor substrate by forming grooves each of which has the inclined surface on the back surface of the semiconductor substrate by etching the semiconductor substrate between the masking patterns using an etchant having an anisotropic etching property,
        wherein the groove between the plurality of masking patterns arranged at the central portion of the semiconductor substrate is a V-shaped groove and the groove between the plurality of masking patterns arranged at the peripheral portion of the semiconductor substrate is a trapezoid-shaped groove, and
        wherein a shape of the flat plane section in the cross section is substantially square, and an area of the flat plane section in the cross section is larger than an area of the light receiving section in the cross section.

* * * * *